United States Patent [19]
Hayashi et al.

[11] Patent Number: 4,821,236
[45] Date of Patent: Apr. 11, 1989

[54] SEMICONDUCTOR NONVOLATILE MEMORY

[75] Inventors: Yutaka Hayashi, Ibarakiken; Yoshikazu Kojima, Tokyo; Masaaki Kamiya, Tokyo; Kojiro Tanaka, Tokyo, all of Japan

[73] Assignees: Kogyo Gizyutsuin; Seiko Instruments & Electronics Ltd., both of Tokyo, Japan

[21] Appl. No.: 13,192

[22] Filed: Feb. 9, 1987

Related U.S. Application Data

[63] Continuation of Ser. No. 587,265, Mar. 7, 1984, abandoned.

[30] Foreign Application Priority Data

Mar. 7, 1983 [JP] Japan .................................. 58-37172

[51] Int. Cl.⁴ ............................................. G11C 11/40
[52] U.S. Cl. ................................................... 365/185
[58] Field of Search ................ 365/185, 184; 357/23.5

[56] References Cited

U.S. PATENT DOCUMENTS

| | | | |
|---|---|---|---|
| 4,037,242 | 7/1977 | Gosney | 365/185 |
| 4,163,985 | 8/1979 | Schuermeyer et al. | 365/184 |
| 4,361,847 | 11/1982 | Harari | 365/185 |
| 4,432,075 | 2/1984 | Eitan | 365/185 |
| 4,462,090 | 7/1984 | Iizuka | 365/185 |

Primary Examiner—James W. Moffitt
Attorney, Agent, or Firm—Bruce L. Adams; Van C. Wilks

[57] ABSTRACT

A floating gate type semiconductor non-volatile memory injects carriers from a carrier supply region to a floating gate by a phenomenon called "punch-through" injection in which a space charge region is formed in a semiconductor substrate between the carrier supply region and a carrier injection region so as to accelerate the carriers and inject them into the floating gate without forwardly biasing the carrier injection region or the substrate.

5 Claims, 3 Drawing Sheets

SEMICONDUCTOR NONVOLATILE MEMORY

This is a Rule 62 continuation application of parent application Ser. No. 587,265 filed Mar. 7, 1984 now abandoned which claims priority of Japanese patent application No. 37172/83 filed Mar. 7, 1983.

BACKGROUND OF THE INVENTION

The present invention relates to a floating gate type semiconductor non-volatile memory having a MIS (Metal-Insulator-Semiconductor) structure.

In the prior art, a bipolar injection type memory, which was invented as a low program voltage non-volatile memory, is a device in which minority carriers injected into a semiconductor substrate are accelerated in a depletion region formed under a floating gate electrode so that a part of the carriers are injected into the floating gate electrode. Although the low program voltage non-vilatile memory employing the bipolar injection has an advantage of low program voltage, since the minority carriers are injected into the substrate by using a forward direction current, the memory has the following disadvantages and hence is not particularly suitable for a high density integrated memory.

(1) Since two power sources are required, the circuit and the operation thereof are complicated.

(2) Cross talk among the memory cells is likely to happen since the lives of the minority carriers injected into the substrate are long.

(3) A large power consumption due to the use of forward direction current.

SUMMARY OF THE INVENTION

It is an object of the present invention to provide a semiconductor non-volatile memory suitable for a high density integrating by employing a new injecting method named a "punch-through" injection, in which the forward current is not used to effect injection of the carriers.

DETAILED DESCRIPTION OF PREFERRED EMBODIMENTS

The structure and the operating principle of the present invention will now be described in more detail in conjunction with FIGS. 1 to 8.

Figure 1:
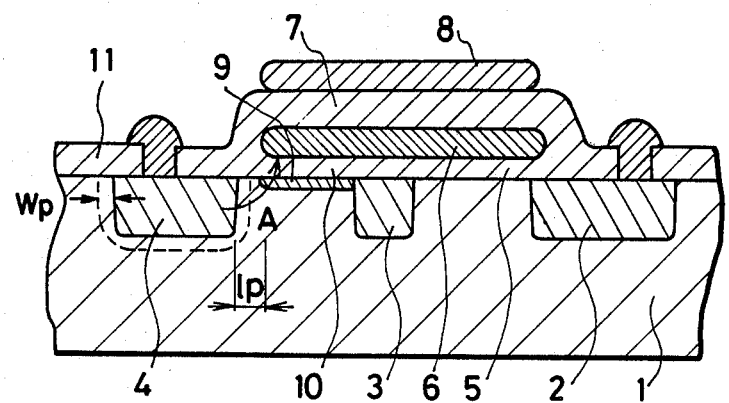
FIG. 1 is a cross-sectional view of a first embodiment of a punch-through injection type semiconductor non-volatile memory of the present invention.

FIG. 1 is a sectional view of a first embodiment of a semiconductor non-volatile memory according the present invention.

First, a description will be made of the structure and then of the operation of the structure. By way of example, the explanation will be given with reference to an N type semiconductor non-volatile memory.

As shown in FIG. 1, N+ type source region 2, N+ type drain region 3 and N+ type carrier supply region 4 (will be referred to as injector region hereinafter, N type is also usable for the injection region instead of N+ type) are formed on the surface of a P type semiconductor substrate 1. A floating gate electrode 6 made of polycrystal silicon is provided, through a gate insulating film 5, on the surface of the semiconductor substrate 1 between the source region 2 and the drain region 3. Furthermore, a control gate electrode 8 is formed on the floating gate electrode 6 through a gate insulating film 7. The control gate 8 is strongly coupled with the floating gate electrode 6 by capacitance coupling, and the control gate 8 serves to control the potential of the floating gate electrode 6. The floating gate electrode 6 is formed over the drain region 3 and over an injection region 9 which is in contact with the drain region 3, through an insulating film 10. The carrier supply region 4, from which the injection carriers are supplied, is located at a position spaced apart from the injection region 9 by a distance LP.

Next, the method of reading out of the memory will be described.

The reading out operation of a memory transistor is carried out by utilizing the fact that the threshold voltage of a channel region between the source and the drain regions for the control gate electrode 8 varies in accordance with the amount of charge on the floating gate electrode 6. That is, when a large number of electrons are injected in the floating gate electrode (in the case writing operation is made), the threshold voltage of the memory transistor is high. On the other hand, the threshold voltage is low for less electrons.

Therefore, the data in the memory can be read out by detecting the channel conductance at the time a constant voltage is applied to the control gate electrode 8.

Figure 2:
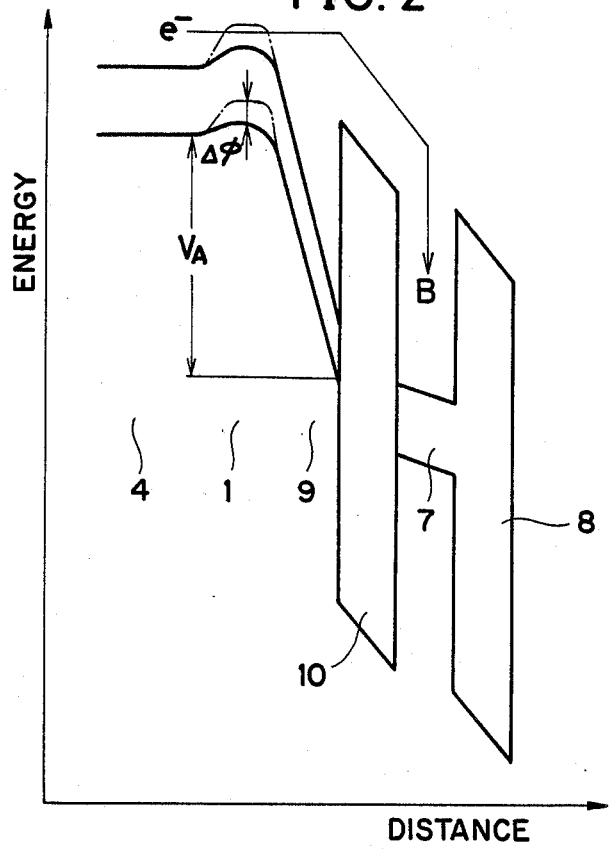
FIG. 2 is an explanatory view showing an energy band structure along the arrow A in FIG. 1.

Next, the description is made how to write the data in the memory in conjunction with FIGS. 1 and 2.

FIG. 2 is a view showing an energy band structure along the arrow A in FIG. 1. The surface potential of the injection region 9 becomes low as shown in FIG. 2 due to the potential of the drain region 3 which is an injection region/potential control region and due to the potential of the control gate electrode 8. A space charge region is formed due to the differences in respective potentials in a space charge forming region between the carrier supply region 4 and the injection region 9 formed on the semiconductor substrate. Consequently, as shown in FIG. 2, the potential of the space charge forming region in the region of the semiconductor substrate, which is shown by the solid line, lowers below the broken line, and electrons are accelerated and injected from the carrier supply region 4 to the floating gate electrode 6 in the direction of the arrow B. A feature of the present invention resides in that electrons are injected from the carrier supply region 4 to the floating gate electrode 6 through an insulating film portion 10 of the gate insulating film 5 by lowering the potential in the space charge forming region on the semiconductor substrate 1 where the electrons are accelerated by the potential in the injection region 9. This injection method is named "punch-through injection". The punch-through injection, as is obvious from the above explanation, is an injection method in which the injection region and the substrate are not biased in the forward direction. Namely, the injection region 9 is biased in the forward direction with respect to the substrate 1 or the voltage of the injection region 9 is the same as the voltage of the substrate 1. As described herein, all of the voltage values are with respect to the voltage of the substrate 1.

The punch-through injection according to the present invention is a method in which charges from the carrier supply region 4 are accelerated to the floating gate electrode by lowering the potential of the space charge forming region on the semiconductor substrate 1 between the carrier supply region 4 and the injection region 9 without heightening the potential of the source region 2.

When a bias voltage is not applied between the injection region 9 and the substrate 1, i.e., the voltage of the injection region 9 is equal to the voltage of the substrate 1, the condition for the punch-through injection can be expressed as follows:

$$V_A/\text{IP} \cdot W_P \simeq \Delta\phi \simeq 2\phi_f$$

wherein $V_A$; a difference in potential between the carrier supply region 4 and the injection region 9;

IP; a distance between the carrier supply region 4 and injection region 9;

$W_P$; width of the depletion layer between the carrier supply region 4 and the substrate 1;

$\Delta\phi$; the decrease in potential in the space charge forming region formed between the carrier supply region 4 and the injection region 9 by the injection region 9; and $2\phi_f$; $\phi_f$ is a Fermi level of the substrate 1 and the value of $2\phi_f$ is required as $\Delta\phi$ for changing P type substrate to N type substrate.

For example, when IP=1 μm, and a concentration NA of the substrate is $10^{16}$ atoms·cm$^{-3}$, the punch-through injection will happen if the drain voltage and the control gate voltage are applied in such a way that $V_A$ is equal to 7 V.

Generally, the distance IP is equal or less than 1 μm. The length of the distance can be controlled by the use of the technique of fine fabrication, however, it can be controlled by the utilization of the side etching of the floating gate electrode 6 without high fine machining technique.

Next, a second embodiment of a semiconductor nonvolatile memory of the present invention will be described in conjunction with FIG. 3.

Figure 3:
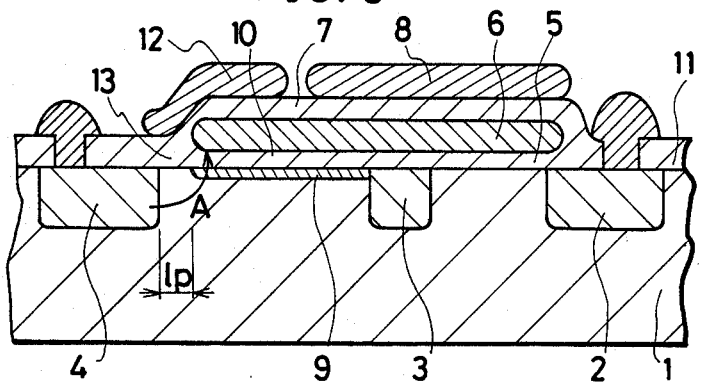
FIGS. 3 to 8 are sectional views of other embodiments of a punch-through injection type semiconductor non-volatile memory of the present invention.

In the second embodiment shown by FIG. 3, a second control gate electrode 12 is formed through a gate oxide film 13 on the semiconductor surface of the space charge forming region between the carrier supply region 4 and the injection region 9. In the case of the first embodiment shown in FIG. 1 and FIG. 2, the potential of the space charge forming region is liable to be affected by the outer potential of the semiconductor surface, and to be unstable in the memory characteristics. In order to overcome this drawback of the first embodiment, the second control gate electrode 12 in the second embodiment of the present invention shown in FIG. 3 is formed. With the second control gate electrode 12, the potential of the space charge forming region is controlled by only the voltages of the control gate electrode 8 and the drain region 3. Since the potential of the space charge forming region can be determined free from the outer potential of the semiconductor substrate surface, stable memory characteristics can be obtained. In the second embodiment, for the punch-through injection at the charge injection, it is necessary to lower the potential of the second control gate electrode 12 in such a way that the maximum current path (or minimum current path) is not formed on the semiconductor surface. Therefore, according to the punch-through injection of the present invention, the maximum current path is not in the inversion layer of the semiconductor surface but in the inner or interior portion of the substrate.

Next, a third embodiment of a semiconductor nonvolatile memory of the present invention will be described in conjunction with FIG. 4.

Figure 4:
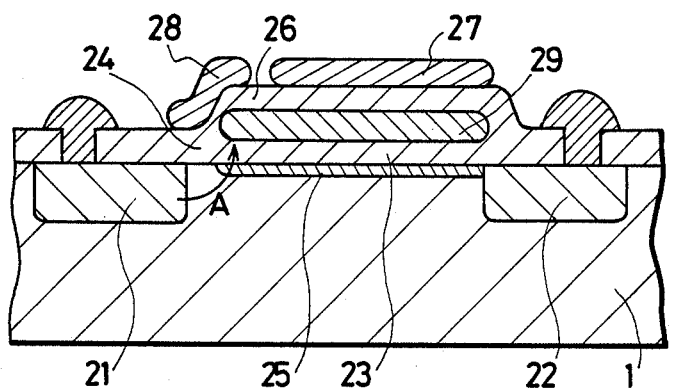

In the third embodiment shown in FIG. 4, a carrier supply region 21 acts as a source region of the memory transistor.

That is, a source region 21 and a drain region 22 are formed on the surface of the semiconductor substrate 1, a second control gate electrode 28 which is adjacent to the source region 21 and a floating gate electrode 29 which is adjacent to the drain region 22 are formed on a channel region between the source and the drain regions, and furthermore, a control gate electrode 27 is formed on the floating gate electrode 29 through an insulation film 26.

The channel region 25 under the floating gate electrode 29 acts as an injection region.

The channel region under the second control gate electrode 28 is called the space charge forming region and this space charge forming region acts as the space change region when the carriers are injected into the floating gate electrode 29.

First, a method of reading out will be described. The voltage is applied to the second control gate electrode 28 in such a way that the surface of the channel region under the gate insulation film 24 is sufficiently inverted. When a constant voltage is applied to the control gate electrode 27, the channel conductance between the source and the drain regions varies in accordance with the amount of charges in the floating gate electrode 29. That is, the information in the floating gate electrode 29 is read out.

In the writing operation, the punch-through injection is used in a manner similar to the second embodiment of the present invention shown in FIG. 3. In this case, the surface potential of the injection region 25 is decreased by the potential of the drain region 22 and the potential of the control gate electrode 27. As a result, the potential of the space charge forming region between the source region 21 and the injection region 25 is also decreased, and the electrons are accelerated from the source region 21 to the floating gate electrode 29 in the direction designated by arrow A. That is, the punch-through injection occurs. At this time, the accelerated electrons under the gate insulation film 24 are accelerated not on the the substrate surface but through the inner portion of the substrate.

Next, a fourth embodiment of a semiconductor nonvolatile memory of the present invention shown in FIG. 5 will be described.

In the fourth embodiment, the drain region 22 is able to act as the control gate electrode. That is, in order to control the potential of the floating gate electrode 29 by only the potential of the drain region 22, the degree of the capacitance coupling between the floating gate electrode 29 and the drain region 22 is set to be closer (as shown in FIG. 5, this can be realized by increasing the size of the overlap area of the floating gate electrode 29 and the drain region 22).

Therefore, the potential of the injection region 25 is also determined by only the potential of the drain region 22.

The reading-out operation is carried out by inverting the channel region under the gate insulation film 24 by the potential of the second control gate electrode 28, and detecting the channel conductance when a constant drain voltage having a predetermined level is applied to the drain region 22. When a large number of electrons are injected in the floating gate electrode 29, the threshold voltage of the channel region is large and the channel conductance is small. On the other hand, the channel conductance is large for less electrons in the electrode 29.

The writing operation is carried out by the punch-through injection which occurs at the portion between the source region 21 and the injection region 25. The potential of the injection region 25 can be selected by the potential of the drain region 22.

Next, a fifth embodiment of a semiconductor non volatile memory of the present invention will be described with reference to in FIG. 6, this embodiment differing from the previous embodiments in that the punch-through injection is carried out toward the injecting direction to increase the injecting efficiency.

Figure 6:
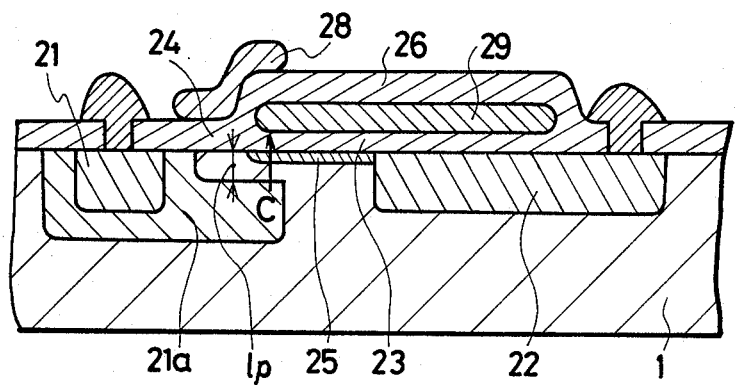

More specifically, in this embodiment, a charge supply region is formed as shown in FIG. 6. That is, as shown in FIG. 6, a source region 21a which is able to act as a carrier supply region is formed just below the injection region 25. Therefore, the electrons are accelerated from the source region 21a to a floating gate electrode 29 along a straight line as shown by arrow C. The potential of the space charge forming region of the semiconductor substrate 1 which is between the source region 21a and the injection region 25 becomes low with the lowering of the potential of the injection region 25, and the electrons are thus accelerated from the source region 21a to the injection region 25. That is, the punch-through injection occurs. In the fifth embodiment shown in FIG. 6, the potential of the injection region 25 is controllable by only the potential of the drain region 22.

Figure 5:
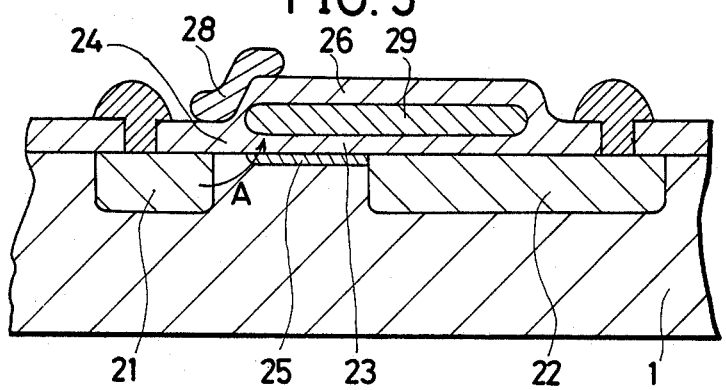

The reading-out operation of the memory transistor is the same as that of the fourth embodiment shown in FIG. 5.

Next, an explanation will be made of a sixth embodiment of a semiconductor non-volatile memory of the present invention.

The sixth embodiment comprises an N⁻ type source region 38 which is able to act as a carrier supply region, a second control region 31, a drain region 32, an injection region 39, and a floating gate electrode 37 formed through an insulation film 36 on the surface channel region of a P type second control region 31 between the source-drain regions and the drain region 32.

The reading-out operation can be executed by utilizing the fact that the channel conductance of the channel region between the source regions depends on the amount of charge in the floating gate electrode.

Next, an explanation will be made of the write-in method.

The potential of the injection region 39 is lowered by the potentials of the drain region 32 and the second control region 31. The potential of the floating gate electrode 37 increases by the voltage of the drain region 32, so that the channel region of the surface of the second control region 31 is inverted and lowers the potential of the injection region 39 toward the direction of the voltage of the drain region 32. As a result, the potential of the space charge region formed between the second control region 31 is controlled so as to be at a low level by the potential of the injection region 39, and electrons are accelerated toward the floating gate electrode 37 as shown by the arrow D from the source region 38 which functions as the charge supply region. That is, the punch-through injection occurs.

Figure 8:
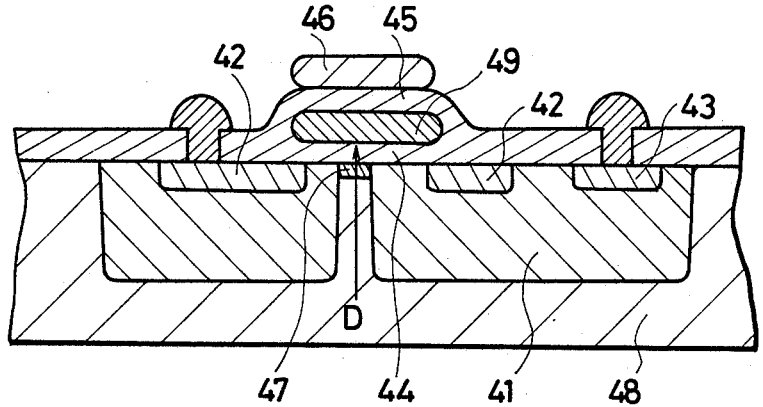

Next, in the seventh embodiment shown in FIG. 8, a control gate electrode 46 for a floating gate electrode 49 is provided separately from a drain region 42 and, at the same time, the drain region 42 is provided so as to surround an injection region 47. The methods for reading out and writing in are approximately the same as those of the sixth embodiment.

Figure 7:
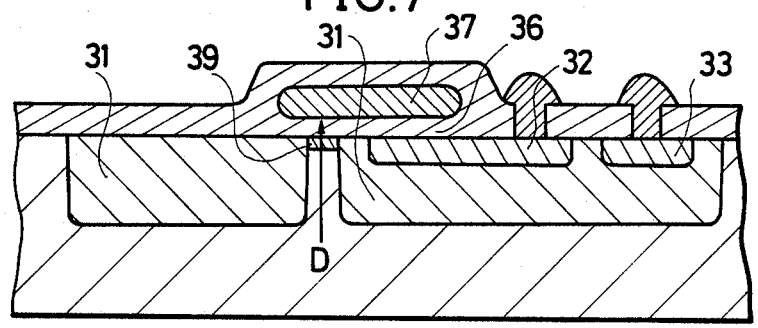

Even if the drain regions 32 and 42 are formed so as to be in contact with the injection regions 39 and 47, respectively, in the embodiments shown in FIG. 7 and FIG. 8, the writing-in operation can be carried out effectively, and the reading-out operation can be also carried out by detecting the change in the conductance of the injection region due to the charge on the floating gate.

As described above, the advantages of the present invention are as follows:

(1) Since the structure is suitable for formation by fine pattern techniques, it is suitable for a high density integrated memory.

(2) Since the injection method does not employ forward direction current, little cross talk between memory cells occurs.

(3) Since the writing operation is carried out by utilizing the punch-through injection which is a high speed phenomenon, high speed writing operation is possible.

N type memory transistors are described in the first through the seventh embodiments of the present invention. However, the present invention is also applicable to P type memory transistors. Furthermore, of course, the present invention can be realized by the use of a semiconductor layer formed on an insulation substrate.

Also, the selection of the writing of the memory cell of the present invention becomes possible by the control of the potential of the carrier supply region, the substrate, the control gate electrode or the second control gate electrode. In the case of the non-selected memory cell, the cell selection operation can be carried out by applying the voltage to each electrode so as not to form a space charge region in the space charge forming region. In the selected memory, it is also possible to apply the voltage to each electrode so as to form a space charge region in the space charge forming region.

We claim:

1. A semiconductor non-volatile memory comprising: a first semiconductor region; a carrier supply region formed on a surface portion of said first semiconductor region; an injection region formed on another surface portion of said first semiconductor region; a first insulation film in contact with said injection region; a control region for controlling the potential of said injection region, said control region being formed so as to make contact with said injection region; a floating gate electrode formed on said first insulation film; a first control gate electrode for controlling the potential of said floating gate electrode through a second insulation flim; said regions being effective when suitably biased to establish a space charge region in said first semiconductor region, between said carrier supply region and said injection region, said space charge region being established by the potential difference between said injection region and said carrier supply region so as to accelerate carriers from said carrier supply region into said space charge region by the potential of said injection region such that the carriers reach the surface of said first semiconductor region at a sufficiently high energy state to cause some of the carriers to exceed the energy barrier formed between said first insulation film and said injection region and be injected into said floating gate electrode.

2. A semiconductor non-volatile memory as claimed in claim 1, further comprising a second control gate electrode for controlling the potential of a space charge forming region for forming said space charge region, said second control gate electrode being formed on said space charge region through a third gate insulation film.

3. A semiconductor non-volatile memory as claimed in claim 2, wherein said control region and said first control gate region comprise a common region.

4. A semiconductor non-volatile memory as claimed in claim 1, wherein said control region and said first control gate region comprise a common region.

5. A semiconductor non-volatile memory as claimed in claim 1, wherein a distance 1 between said carrier supply region and said injection region is nearly equal to or shorter than the value of $l_p$ satisfying the equation $$V_A/l_p \cdot W_p \simeq 2\phi_f$$

where $V_A$ represents the difference in potential between said carrier supply region and said injection region, $W_p$ represents the width of the depletion layer between said carrier supply region and said substrate, and $\phi_f$ represents the Fermi level of the substrate.

* * * * *